United States Patent
Norman

(10) Patent No.: US 8,295,073 B2
(45) Date of Patent: Oct. 23, 2012

(54) NON-VOLATILE DUAL PORT THIRD DIMENSIONAL MEMORY

(75) Inventor: Robert Norman, Pendleton, OR (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 361 days.

(21) Appl. No.: 12/592,319

(22) Filed: Nov. 23, 2009

(65) Prior Publication Data

US 2010/0195362 A1    Aug. 5, 2010

Related U.S. Application Data

(60) Provisional application No. 61/206,447, filed on Jan. 30, 2009.

(51) Int. Cl.
*G11C 11/00* (2006.01)
(52) U.S. Cl. ........ 365/148; 365/158; 365/163; 365/171; 365/173
(58) Field of Classification Search ............ 365/51, 365/131, 148, 158, 163, 171, 173
See application file for complete search history.

(56) References Cited

U.S. PATENT DOCUMENTS 6,151,242 A * 11/2000 Takashima ............ 365/145
7,106,639 B2 * 9/2006 Taussig et al. .......... 365/200

* cited by examiner

*Primary Examiner* — Pho M Luu
*Assistant Examiner* — Thao Bui
(74) *Attorney, Agent, or Firm* — Stolowitz Ford Cowger LLP

(57) ABSTRACT

Non-volatile dual port memory with third dimension memory is described, including a non-volatile third dimensional memory array comprising a memory element, the memory element is configured to change from a first resistive state to a second resistive state in response to a voltage, a transceiver gate configured to gate the voltage to the memory element, the voltage being configured to change the memory element from the first resistive state to the second resistive state, the transceiver gate is configured to receive another voltage from a bit line and a bit bar line, the bit line and the bit bar line being coupled to the memory element and configured to provide the another voltage, and a plurality of word lines coupled to the memory element, the plurality of word lines are configured to provide substantially simultaneous access to the non-volatile third dimensional memory array using two or more ports.

31 Claims, 11 Drawing Sheets

NON-VOLATILE DUAL PORT THIRD DIMENSIONAL MEMORY

FIELD OF THE INVENTION

The present invention relates generally to semiconductors and memory technology. More specifically, the present invention relates to dual port third dimensional non-volatile memory.

BACKGROUND

Memory refers to a form of solid-state storage that is used in the core function of the modern computer. Memory architectures address different usages to store information. These architectures vary depending on the application and technology available. Conventional memory technologies typically are implemented using semiconductor-based storage. Semiconductor memories use integrated circuits to store information. Conventional integrated circuits may have characteristics that limit their use over short or long time intervals, depending upon a given application. In some conventional solutions, the characteristics of conventional solutions typically include volatility, area, and performance. Volatility of semiconductor memory is a limiting factor for the stability of the stored information.

In some conventional solutions, it should be appreciated that a semiconductor memory can be powered using a three-terminal configuration. In other words, a semiconductor memory is supplied power with the use of a positive terminal, a negative terminal, and a common terminal. Three-terminal configurations typically limit supply voltage flexibility and power consumption reductions. Further, layouts of a three-terminal memory are not ideal, typically requiring an area of $8f^2$ for each memory element, where f is the minimum feature size. Area size and increasing memory capacity demand complicates the development of conventional memory systems that require increased storage capacity.

In other conventional solutions, simultaneous access to a memory element is implemented to increase performance (i.e., the speed of access) to conventional memory systems. Simultaneous or substantially (i.e., near) simultaneous access typically includes a read and write operation that may be performed using a common memory element. In some conventional solutions, a memory element can be read from one port while enabling a secondary port to perform a write operation. Conventional technologies such as Flash® are not typically used for dual port memory usage. However, due to the requirement to perform an erase operation prior to a write operation, latencies in performing write operations increase and access speeds are limited.

In some conventional solutions, semiconductor memory is used for a number of electronic devices for various applications. As electronic devices become increasingly smaller and faster, requirements for semiconductor memories with reduced cost, size, and power demands are also desirable. However, conventional solutions fail to fulfill these requirements and data is often loss when power is removed. Typically, when power is lost, data is also lost in volatile systems.

There are continuing efforts to improve stable multiple access to non-volatile high capacity memory.

BRIEF DESCRIPTION OF THE DRAWINGS

The invention and its various embodiments are more fully appreciated in connection with the following detailed description taken in conjunction with the accompanying drawings, in which.

Figure 1:
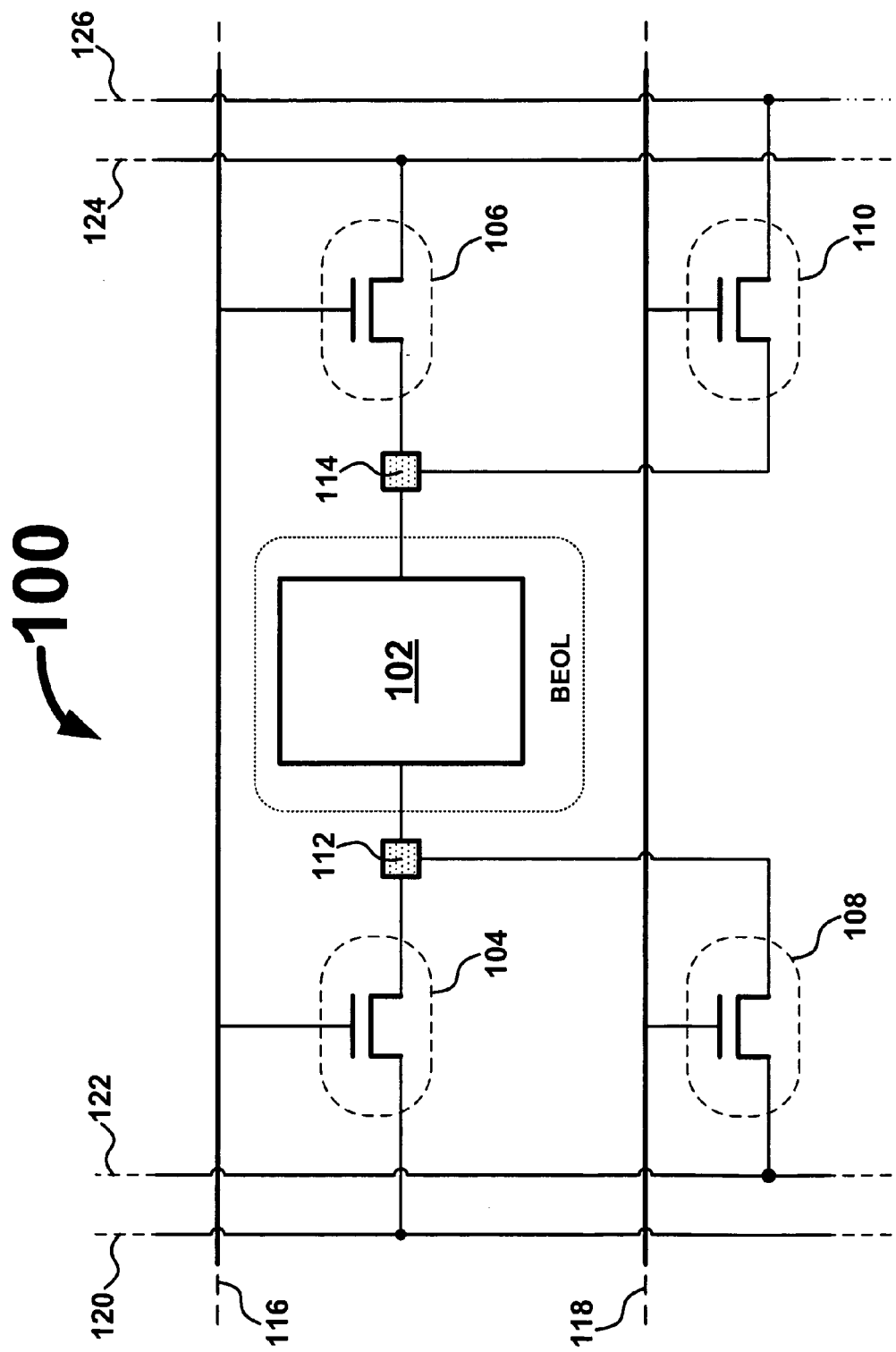
FIG. 1 depicts an exemplary non-volatile, dual port third dimensional memory cell.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, examples, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, non-volatile, dual port memory in third dimensional memory is described. Using non-volatile third dimensional memory such as that described in U.S. patent application Ser. No. 11/095,026, filed Mar. 30, 2005, now U.S. Published Application No. 20060171200, and entitled "Memory Using Mixed Valence Conductive Oxides," and hereby incorporated by reference in its entirety for all purposes and describing non-volatile third dimensional memory elements that may be arranged in a two-terminal, cross-point memory array that can be configured as a single layer of cross-point memory or as multiple vertically stacked layers of cross-point memory. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2.

Accordingly, the memory cells based on non-volatile memory can be fabricated BEOL over circuitry previously fabricated FEOL on a substrate (e.g., a silicon—Si wafer). An inter-level interconnect structure can be used to electrically couple the BEOL memory cells with the FEOL circuitry in the substrate below. Furthermore, the memory cells can be fabricated along with a two-terminal cross-point memory array that is fabricated BEOL above the aforementioned FEOL circuitry positioned on the substrate below. The FEOL circuitry fabricated on the substrate below (e.g., CMOS circuitry) can include circuitry for performing data operations (e.g., read, write, program, and erase) on two-terminal memory cells positioned in the two-terminal cross-point memory array and operative to store data as a plurality of conductivity profiles. The same or different FEOL circuitry can be used to access the memory cells.

FIG. 1 depicts an exemplary non-volatile, dual port third dimensional memory cell. Here, memory cell 100 includes third dimensional memory element 102, gates 104-110, vias 112-114, word lines 116-118, bit lines 120-122, and bit bar lines 124-126. Gates 104-110 can be various types of gates, depending on the voltages used for the operation. These gates are drawn as standard gates, but if positive and negative voltages are used, then transmission gates should be used. As used herein, a gate may be referred to or described as a MOSFET-type device or access transistor. In some examples, access transistors 104-106 are activated when enabling word line 116. A voltage provided by bit line 120 and bit bar line 124 causes a resistive effect that changes the electrical properties of third dimensional memory element 102. Changes in electrical properties (i.e. resistivity) may include a polarity (e.g., reversibly-induced electrical field effect) and voltage difference that may be sensed or read across third dimensional memory element 102. Polarity and voltage differences cause third dimensional memory element 102 to change from one resistive state to another resistive state, allowing output voltages to be sensed to determine whether a "1" or "0" is stored by memory element cell 100 (i.e., resistivity is high, indicating that a "0" is being stored or resistivity is low, indicating that a "1" is stored in third dimensional memory element 102). In some examples, the above-referenced polarity may be revered, based on various types of sensing methodologies selected and used. Third dimensional memory element ("memory element") 102 connects to gate logic (e.g., logic that determines whether to gate voltages attempting to access memory element 102) using vias 112-114, which may be used to conduct voltages to different elements or cells residing on different vertical layers in a third dimensional memory. As used herein, gate logic may include MOSFET-type devices, control logic, or drivers. As a further example, a secondary port may be enabled by word line 118 to access the third dimensional memory element with the use of access transistors 108-110 through vias 112-114. This secondary port may receive the voltage from bit line 122 and bit bar line 126. In some examples, the voltage may refer to the logical state to be stored within the third dimensional memory element. Logical state, in some examples, may refer to the state of memory cell 100 that, when evaluated, identifies whether a "1" or "0" is being read or written. In other examples, memory cell 100 and the above-described elements (i.e., all elements shown and indicate by reference numerals above) may be implemented differently in design, operation, configuration, and materials, and are not limited to the descriptions provided herein.

Figure 2:
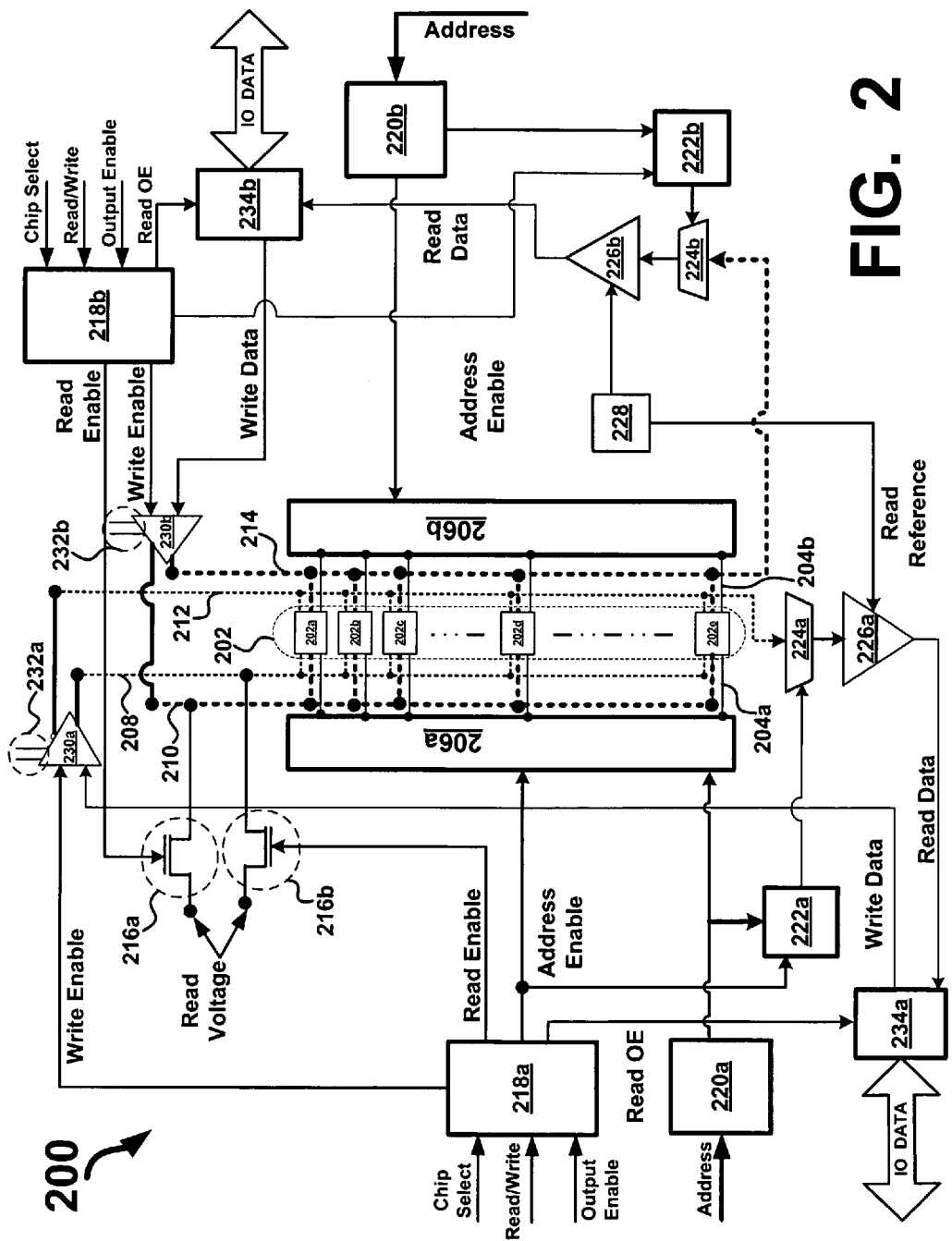
FIG. 2 depicts an exemplary non-volatile, dual port read and write third dimensional memory system.

FIG. 2 depicts an exemplary non-volatile, dual port read and write third dimensional memory system Here, system 200 includes third dimensional memory array 202, word lines 204a-b, row decoders 206a-b, bit lines 208-210, bit bar lines 212-214, read transistors 216a-b, control logic 218a-b, address buffers 220a-b, column decoders 222a-b, multiplexers 224a-b, sense amplifiers 226a-b, reference cell 228, write drivers 230a-b, program voltages 232a-b, and interface transceivers 234a-b. In some examples, third dimensional memory array 202, which may include one, two, three, or multiple (i.e., "n") memory elements 202a-e. Further, multiple memory arrays (e.g., third dimensional memory array 202) may be implemented and are not limited to the examples shown and described.

In some examples, system 200 may be implemented to provide dual port access to memory array 202 to perform both read and write operations, as described in further detail below. Here, system 200 may be configured to read and write data to/from third dimensional memory array 202 simultaneously or substantially simultaneously using dual ports, as shown and described. Multiple read operations or multiple write operations may also be performed using system 200. As an example, system 200 may be configured to provide write operations to third dimensional memory array 202. In selecting a memory element (e.g., memory elements 202a-e) within third dimensional memory array 202, for example, memory system 200 may include of row decoder 206a and column decoder 222a to enable a selected memory element. An incoming address provided to address buffer 220a may enable row decoders 206a-b and column decoders 222a-b to locate a given memory element for selection. Control logic 218a may provide command (e.g., generation and transmission of control signals based on a given set of logic) of operations (e.g., read and write operations), allowing voltages (e.g., "voltage enables," which are voltages that enable or activate a given component, such as those described herein) to be gated to a given memory element (e.g., memory element 102 in FIG. 1) to turn on (e.g., activate) gate logic. Depending on the operation indicated by control logic 218a, voltages may travel through bit line 208 and bit bar line 212 from write driver 230a or to sense amplifier 226a. Interface transceiver 234a may support bidirectional flow of voltage to and from third dimensional memory array 202.

In other examples, memory system 200 may employ the use of another port comprising of row decoder 206b and column decoder 222b to enable a selected memory element for another operation, for example, such as a read operation performed on one of memory elements 202a-e. Using dual ports as shown in system 200 and described herein, simultaneous or substantially simultaneous operations may be performed, such as a read operation as described below. Alternatively, another write operation may be performed using the configuration shown, thus allowing fast access to memory array 202 and memory elements 202a-e. Further, data may be written to memory elements 202a-e without performing an erase operation beforehand, which provides fast access to memory array 202.

Here, an incoming address provided to address buffer 220b may be interpreted by row decoders 206a and column decoders 222a-b to locate a memory element (e.g., memory elements 202a-e) for selection. Control logic 218b may provide command of operations (e.g., read and write operations) and voltage enables to turn on the gate logic to third dimensional memory array 202. Depending on what operation is selected by control logic 218b, voltage may travel through bit line 210 and bit bar line 214 from write driver 230b or to sense amplifier 226b. The interface transceiver 234b may support bidirectional flow of the voltage to and from the third dimensional memory array.

In still other examples, system 200 and the above-described elements (e.g., all elements shown and indicate by reference numerals above) may be implemented differently in design, operation, configuration, and materials, and are not limited to the descriptions provided herein.

Figure 3:
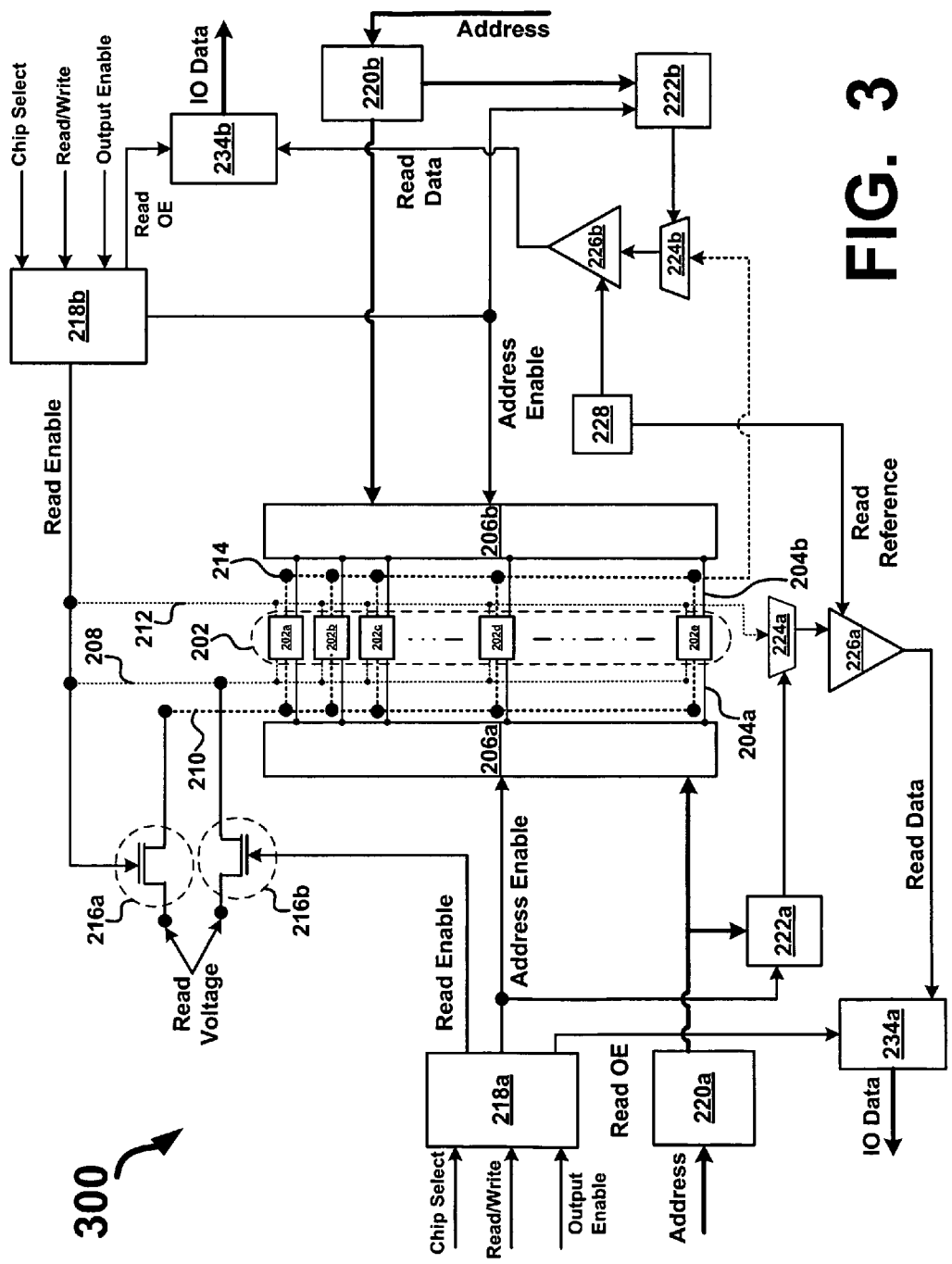
FIG. 3 depicts an exemplary read data path in a non-volatile, dual port third dimensional memory system.

FIG. 3 depicts an exemplary read data path in a dual port third dimensional memory system. Here, system 300 includes third dimensional memory array 202, word lines 204a-b, row decoders 206a-b, bit lines 208-210, bit bar lines 212-214, read transistors 216a-b, control logic 218a-b, address buffers 220a-b, column decoders 222a-b, multiplexers 224a-b, sense amplifiers 226a-b, reference cell 228, and interface transceivers 234a-b. In some examples, third dimensional memory array 202, which may include one, two, three, or multiple (e.g., "n") memory elements 202a-e. Further, multiple memory arrays (e.g., third dimensional memory array 202) may be implemented and are not limited to the examples shown and described.

In some examples, system 300 depicts a dual port third dimensional memory array (i.e., memory array 202), with a data flow path ("datapath") that may be used to read data from memory array 202. The following examples described the read datapath for system 300, which may be implemented as part of system 200 (FIG. 2).

As an example, memory array 202 may use read transistors 216a or 216b, turned on by a read enable driven by control logic 218a or 218b, respectively. An address is received and provided by address buffer 220a to be decoded by row decoder 206a, which uses a decoded address to enable (i.e., activate or provide a gating voltage to) word line 204a to select one of memory elements 202a-e within memory array 202. Data is read from one of the selected memory elements (e.g., memory elements 202a-e) by read transistor 216a gating, allowing, supplying, or otherwise providing ("providing") a read voltage onto one of bit lines 208 or 212. In some examples, read transistors 216a-b may enable the read voltage onto bit lines 208 or 210, respectively. A read voltage may be provided to a selected memory element by creating a voltage drop across the selected memory element to bit bar line 212 or 214. The voltage drop signal present at either bit bar line 212 or 214 is directed through multiplexers 224a or 224b to sense amplifiers 226a or 226b. Sense amplifier 226a compares a voltage drop signal to a read reference signal provided by reference cell 222a or 222b. In some examples, a read reference signal provided by reference cell 222a or 222b helps sense amplifier 226a or 226b determine the resistive state of a given memory element. For example, a read reference signal may be half the difference between two resistive values (e.g., +1V and 0V are two resistive values and a read reference signal may be +0.5V) and provided to multiplexers 224a-224b, which are then used by sense amplifiers 226a or 226b to determine a logical state (e.g., "1" or "0") for a selected memory element (e.g., memory elements 202a-e). Sense amplifiers 226a or 226b toggle output to a logical state, which may be evaluated to determine a binary value. Binary values are routed to interface transceivers 234a or 234b, which are gated to a system bus (not shown) based on an output enable signal provided by control logic 218a or 218b, which may be implemented together on the base layer of third dimensional memory array 202, as shown and described in further detail below in connection with FIGS. 5 and 6 and as incorporated by reference above. System memory array 202 may perform read operation using two or more ports and datapaths, as described above. In other examples, memory array 300 and the above-described elements (i.e., all elements shown and indicate by reference numerals above) may be implemented differently in design, operation, configuration, and materials, and are not limited to the descriptions provided herein.

Figure 4:
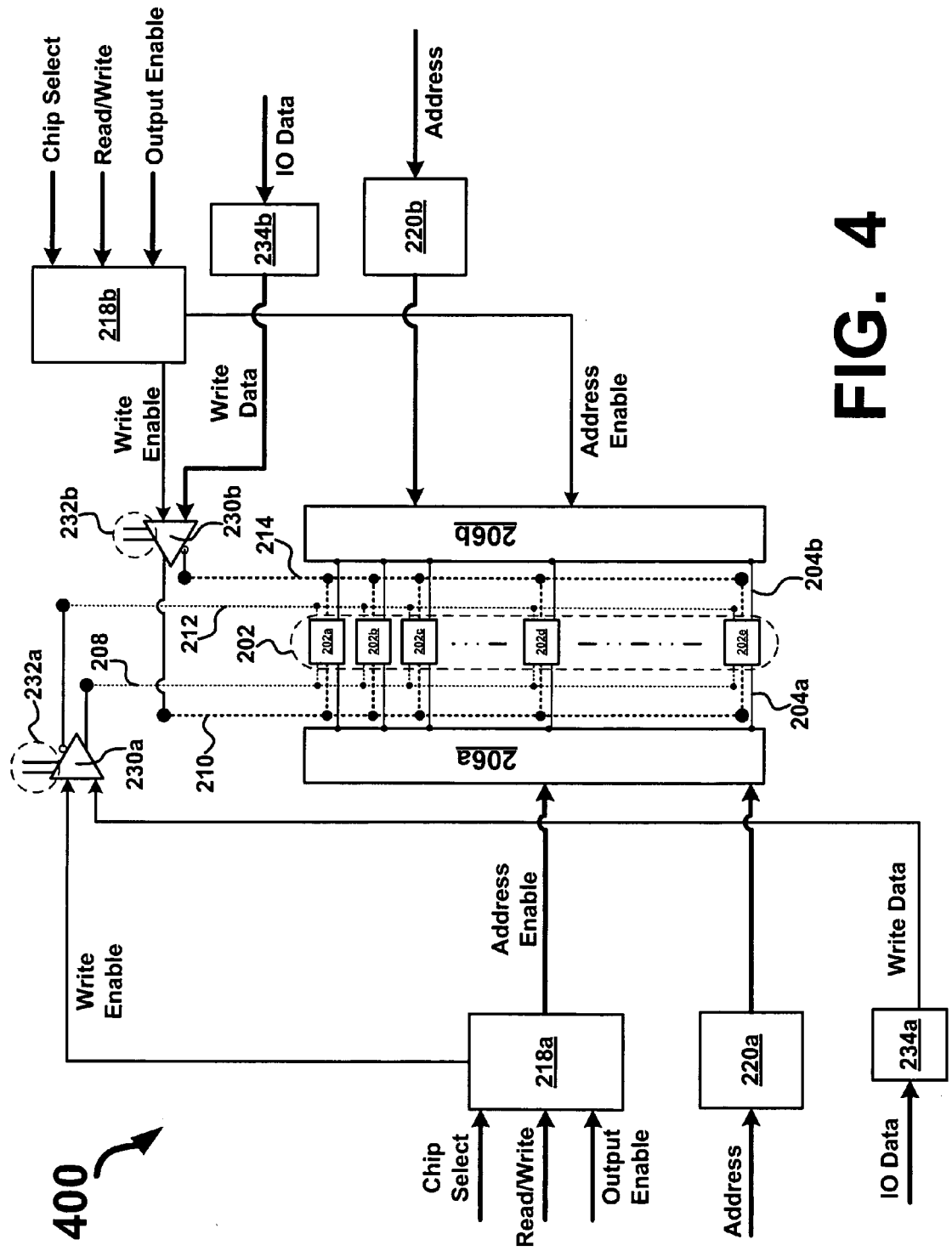
FIG. 4 depicts an exemplary write data path in a non-volatile, dual port third dimensional memory system.

FIG. 4 depicts an exemplary write data path in a dual port third dimensional memory system. Here, system 400 includes third dimensional memory array 202, word lines 204a-b, row decoders 206a-b, bit lines 208-210, bit bar lines 212-214, control logic 218a-b, address buffers 220a-b, write drivers 230a-b, program voltages 232a-b, and interface transceivers 234a-b. In some examples, system 400 may be used to implement an exemplary write datapath for dual port access to a third dimensional memory array (e.g., third dimensional memory array 202). Further, multiple memory arrays (e.g., third dimensional memory array 202) may be implemented and are not limited to the examples shown and described. Write operations may be performed by receiving data to be written to memory array 202 and memory elements 202a-e at interface transceivers 234a or 234b, which determine the gating voltage (e.g., the driving voltages generated by write drivers 230a-b) generated by write drivers 230a-b and used to drive bit lines 208-210 and bit bar lines 212-214 to make the desired resistive effect at the selected memory elements (i.e., memory elements 202a-e). As an example, an address is received at address buffers 220a-b and provided row decoder 206a, which generates a decoded address that is used to enable word lines 204a-b to select one or more of memory elements 202a-e from memory array 202. A write voltage is provided to one or more of memory elements 202a-3 by write driver 230a-b. Voltages provided to write drivers 230a-b (e.g., program voltages) turn on or activate write drivers 230a-b. In other examples, program voltages may be voltage signals that indicate a "high" voltage (e.g., +1V in a range of +1V to −1V). Polarity and voltage differences read across one of selected memory elements 202a-e may indicate a resistive effect, as described above, has occurred when a voltage generated by write drivers 230a-230b (i.e., driving voltage) is applied to memory elements 202a-3. A resistive effect may be a switch from one resistive state to another resistive state, which may be interpreted as a "high" or "low." In still other examples, writing operations may occur with positive voltages, negative voltages, or a combination of positive and negative voltages. In some other examples, memory array 202 may perform write operations simultaneously or substantially simultaneously using two or more ports. Further, write operations using the write datapath described above or a variation thereof may be performed using dual ports in third dimensional memory array 202 without requiring an erase operation to be performed beforehand. In other examples, memory array 400 and the above-described elements (i.e., all elements shown and indicate by reference numerals above) may be implemented differently in design, operation, configuration, and materials, and are not limited to the descriptions provided herein.

Figure 5:
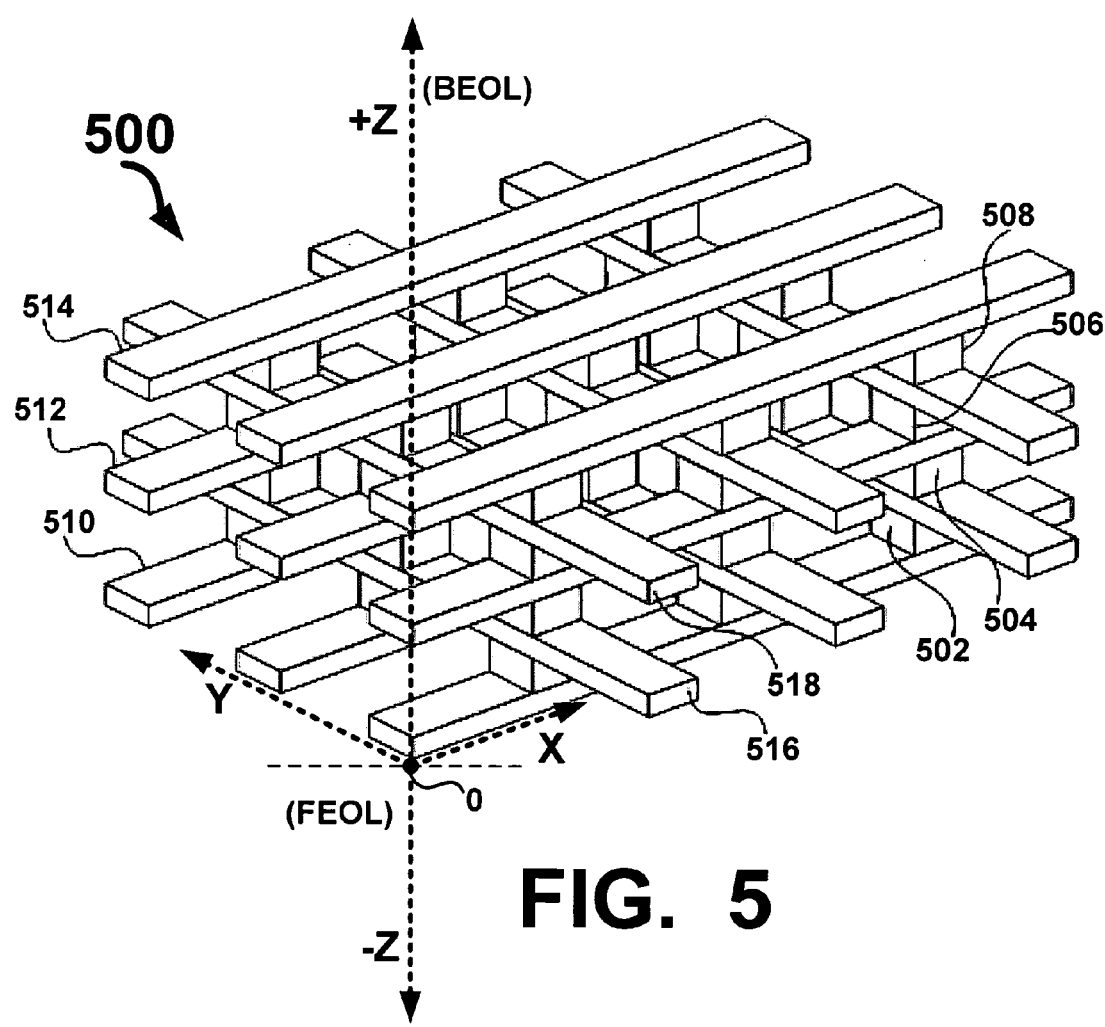
FIG. 5 depicts an exemplary non-volatile, third dimensional memory array using cross-point architecture.

FIG. 5 depicts an exemplary non-volatile, third dimensional memory array using a cross-point architecture. Here, cross-point memory array 500 includes memory layers 502-508 that are vertically stacked one above the other along a positive Z axis +Z, x-direction conductive array lines 510-514 that are aligned with an X axis, and y-direction conductive arrays lines 516-518 that are aligned with a Y axis. In some examples, cross-point memory array employs four memory layers 502-508. The one or more memory layers can be fabricated BEOL along the +Z axis (e.g., above the origin of the axes at 0). Active circuitry for performing data operations on the one or more layers of memory 502-508 can be fabricated FEOL on a substrate positioned below (e.g., along the −Z axis below the origin of the axes at 0) and in contact with the memory layers 502-508. Memory layers, 502-508, are sandwiched between alternating layers of x-direction conductive array lines 510-514 and y-direction conductive arrays lines, 516-518. In that the above-described examples of third dimensional memory array 202 use a single bit line. Alternatively, 8, 16 or 32 bits in parallel may be simultaneously or substantially simultaneously accessed, which are not shown for purposes of clarity. Stacking vertically along a +Z axis allows for a memory device (e.g., system 200 (FIG. 2), system 300 (FIG. 3), system 400 (FIG. 4)) to increase memory capacity without increasing the footprint of the cross point array 500. A "memory layer," as the term is used herein, is not necessarily a homogenous layer of material, but a layer of memory elements, such as two-terminal memory elements, for example. Memory elements can be made up of several different layers of thin film materials. The term "element" is meant to be generally applicable to any stack or formation between complementary conductive array lines, and not intended to be limited to any manufacturing process. Memory elements and memory cells are described in greater detail below in reference to FIGS. 6A-8A.

Additional examples of vertically stacked two-terminal cross-point memory arrays are depicted below in FIGS. 8B, 9, and 10. The memory planes in the vertically stacked two-terminal cross-point memory arrays can have arrays with electrically isolated conductive array lines in each memory plane (see 825a, 825b, . . . 825n in FIG. 8B) or memory cells in adjacent memory planes can share conductive array lines (see FIGS. 9 and 10).

Figure 6:
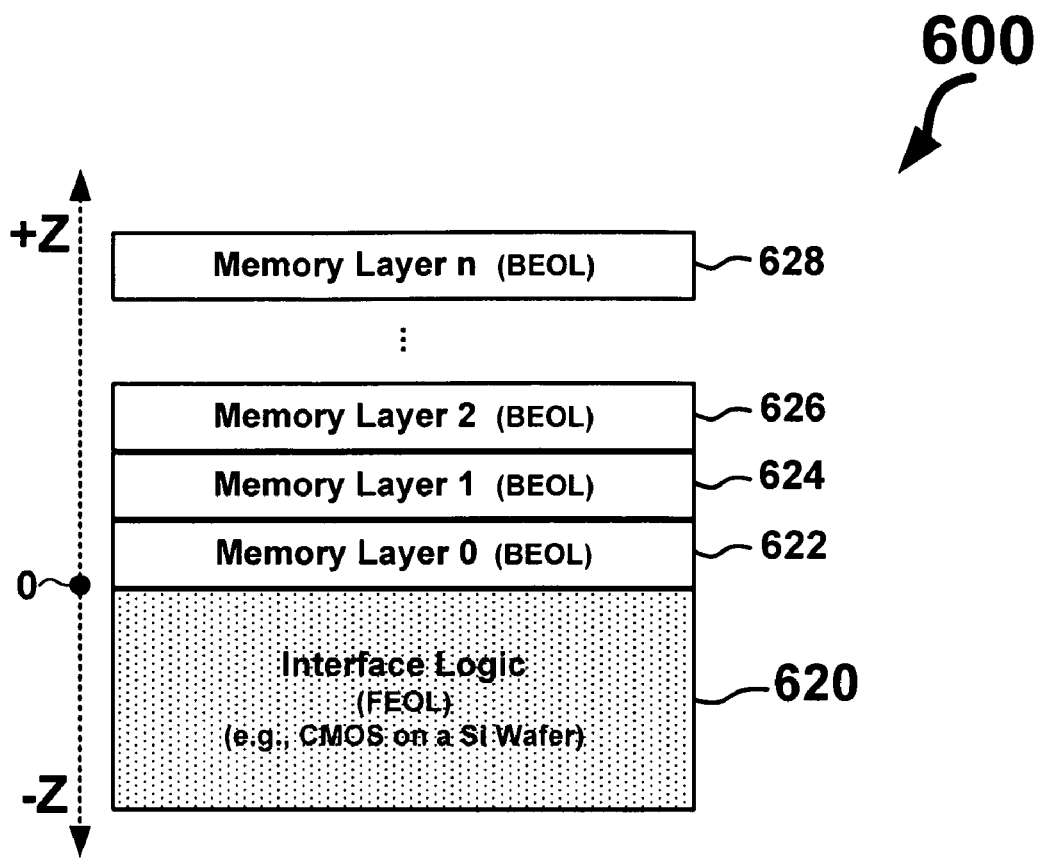
FIG. 6 depicts an exemplary cross-sectional view of a vertically configured non-volatile, third dimensional memory array.

FIG. 6 depicts an exemplary cross-sectional view of a vertically configured non-volatile third dimensional memory array. Here, memory array includes interface logic 620 and memory layers "0" through "n" 622-628. In some examples, memory array 600 includes interface logic 620 (e.g., control logic 218a-b in FIGS. 2-4), which may be vertically configured with one, two, three, or multiple (i.e., "n") memory array layers 622-628. Each of memory array layers 622-628 may be used for implementing different aspects of a memory system (e.g., system 500 in FIG. 5, and others). For example, a base layer of memory array 600 (e.g., layer 620) may be used to implement control logic or an interface between memory elements (see FIGS. 6A-10) in a memory system (e.g., control logic 218, interface logic 232, and the like), while memory array layers 622-628 may be used to implement memory. Further, memory array layers 622-628 may be used to implement "n" number of memory types, where each of memory array layers 622-628 are configured to emulate a different type of memory (e.g., SRAM, DRAM, NOR, NAND, FLASH, and others). Still further, each of memory array layers 622-628 may be configured, formed, fabricated, or otherwise implemented entirely or partially to emulate a memory type. In other examples, memory array layers 622-628 may be implemented as the same memory type. In still other examples, the number of memory array layers 622-628 may be varied to include more, fewer, or different layers than those shown and described.

As an example, logic may be formed FEOL in layer 620 below the origin 0 along the −Z axis and the one or more layers of memory 622-628 can be fabricated BEOL above the layer 620. Further, memory elements such as those described above may be formed BEOL in memory array layer 622 and layer 624. In still other examples, more, fewer, or different layers than those shown may be used. In other examples, memory array 600 and the above-described elements may be varied and are not limited to the functions, structures, configurations, or implementations provided.

Figure 6A:
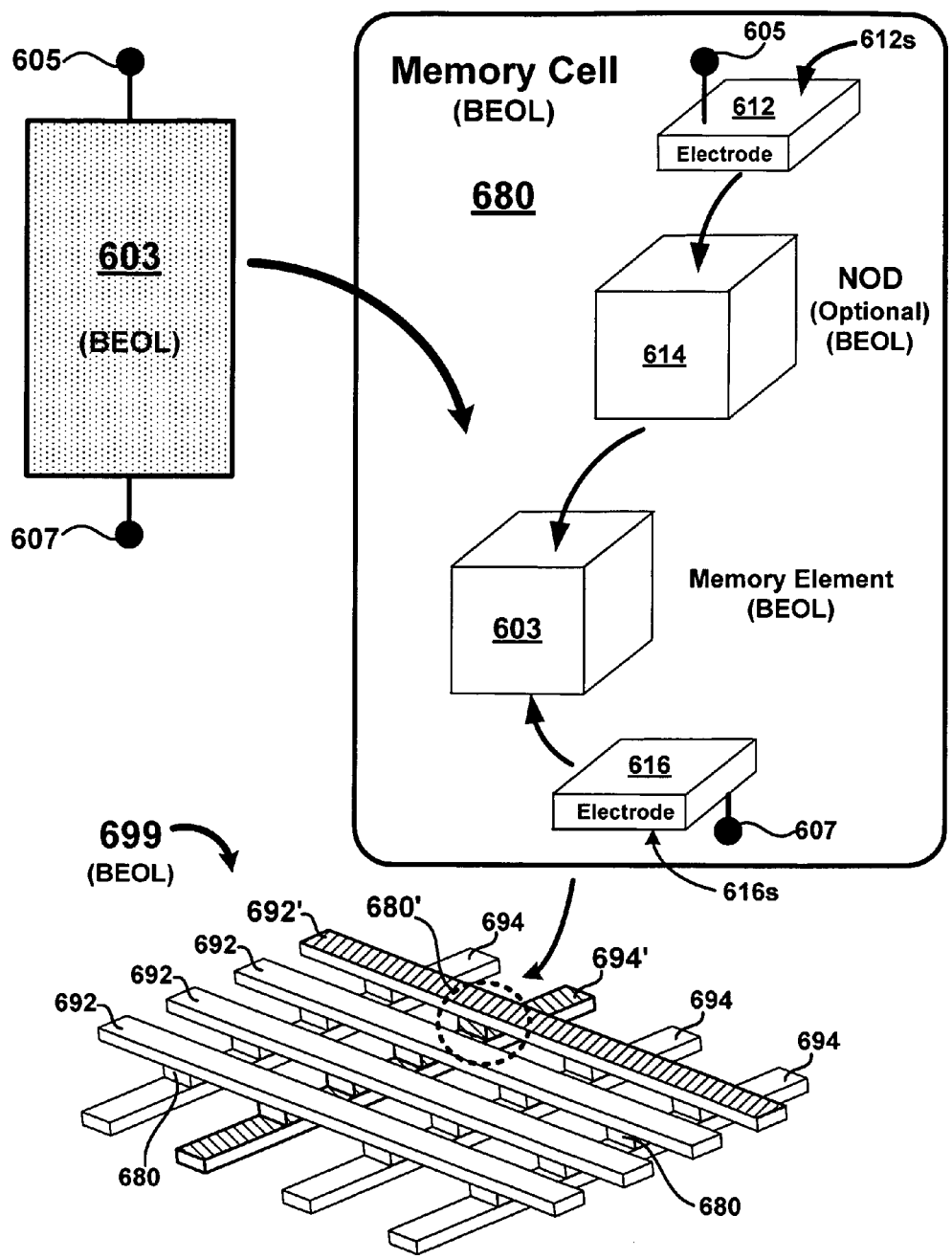
FIG. 6A depicts an example of memory cells positioned in a two-terminal cross-point array.

FIG. 6A depicts an example of arrayed memory cells according to various embodiments of the invention. In this example, a non-volatile re-writable memory cell 680 can be used to implement the aforementioned non-volatile memory elements 102 (FIG. 1) and 202a-202e (FIGS. 2-4). The memory cell 680 includes a memory element 603 and terminals 605 and 607 with the memory element 603 electrically in series with the terminals 605 and 607. In that the memory element 603 is electrically in series with the memory cell 680 and is included in the memory cell 680, the terminology memory cell or memory element may be used interchangeably herein to describe the structure in which non-volatile data is stored. Terminals 605 and 607 can be electrically coupled with or can be formed as electrodes 612 and 616. The electrodes (612, 616) can be made from an electrically conductive material including but not limited to, platinum (Pt), gold (Au), silver (Ag), iridium (Ir), iridium oxide (IrO$_x$), ruthenium (Ru), palladium (Pd), aluminum (Al), and the like.

In at least some embodiments, memory cell 680 can include an optional non-ohmic device (NOD) 614, which, in turn, can be formed on the memory element 603 (e.g., either above or below memory element 603). NOD 614 can be a "metal-insulator-metal" (MIM) structure that includes one or more layers of electronically insulating material that are in contact with one another and sandwiched between metal layers (e.g., electrodes), or NOD 614 can be a pair of diodes connected in a back-to-back configuration. U.S. patent application Ser. No. 11/881,473, filed Jul. 26, 2007, now U.S. Published Application No. 2009-0027976 A1, and entitled "Threshold Device For A Memory Array" and U.S. patent application Ser. No. 12/283,339, filed Sep. 11, 2008, now U.S. Published Application No. 2009-0016094 A1, and entitled "Selection Device for Re-Writable Memory" are both hereby incorporated by reference in their entirety and for all purposes and describe metal-insulator-metal and diode based non-ohmic devices. NOD 614 can be another type of selection device and the present invention is not limited to the examples disclosed herein. The NOD 614 and the memory element 603 are electrically in series with each other and with the terminals 605 and 607. Memory cell 680 can be formed between conductive array lines, such as array lines 692 and 694. Thus, memory cell 680 can be formed in an array of other memory cells. The array can be a cross-point array 699 including a plurality of the conductive array lines 692 and 694, and a plurality of the memory cells 680. For example, array lines 692 can be electrically coupled with the electrodes 612 of the memory cells 680 and/or may be in contact with a surface 612s of the electrodes 612 and array lines 694 can be electrically coupled with the electrodes 616 of the memory cells 680 and/or may be in contact with a surface 616s of the electrodes 616. A memory cell 680' is selected for a data operation (e.g., read or write operation) by applying select voltages (e.g., read voltages, write voltages, program voltages, or erase voltages) to its respective conductive array lines 692' and 694'.

Figure 7:
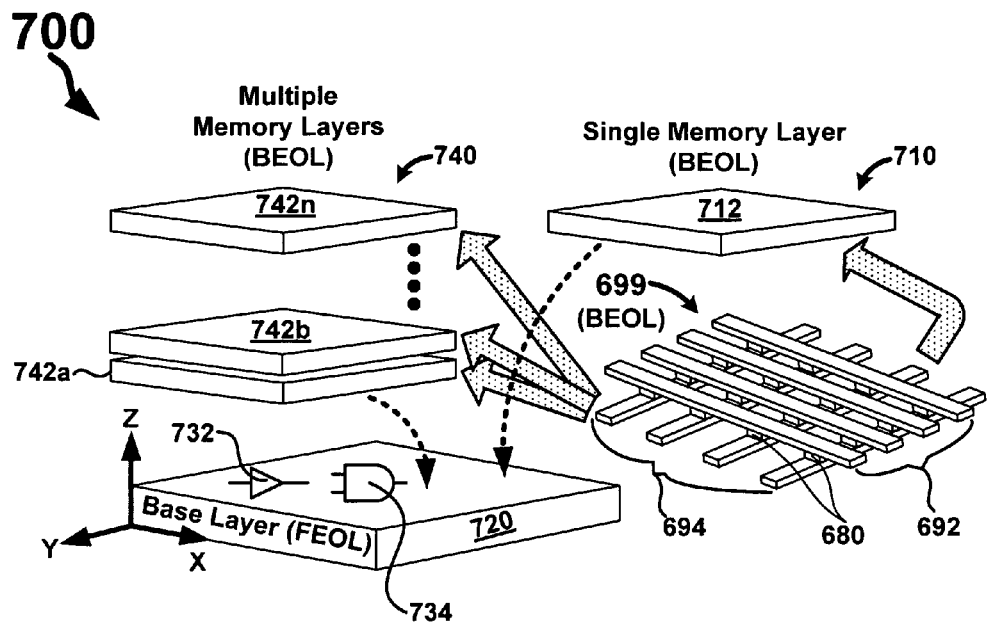
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 700 can include non-volatile and re-writable memory cells 680 disposed in a single layer 710 or in multiple layers 740 of memory, according to various embodiments of the invention. The single 710 or multiple 740 layers of memory can be fabricated BEOL. In this example, integrated circuit 700 is shown to include either multiple layers 740 of memory (e.g., layers 742a, 742b, . . . 742n) or a single layer 710 of memory 712 formed on (e.g., fabricated above) a base layer 720 (e.g., a silicon wafer) that can be used to implement the interface logic 622 depicted in FIG. 6. The single layer 710 or multiple layers 742a, 742b, . . . 742n of memory can be used to implement the layers of memory 622-628 depicted in FIG. 6. The base layer 720 can be fabricated FEOL with the single or multiple layers of memory 710 and/or 740 fabricate BEOL on top of the base layer 720.

In at least some embodiments, each layer of memory (712, or 742a, 742b, . . . 742n) can include the cross point array 699 fabricated (e.g., BEOL) and having conductive array lines (692, 694) arranged in different directions (e.g., substantially orthogonal to one another) to access memory cells 680 (e.g., two-terminal memory cells). For example, conductors 692 can be X-direction array lines (e.g., row conductors) and conductors 694 can be Y-direction array lines (e.g., column conductors). Base layer 720 (e.g., substrate 622 in FIG. 6) can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 732 and 734 are fabricated. The active circuitry 732 and 734 can include analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
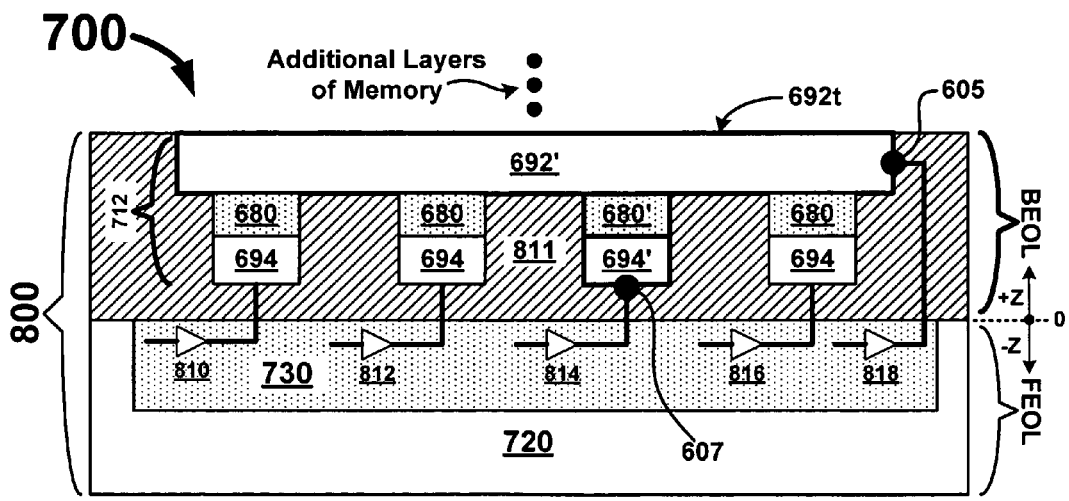
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 732 and 734 fabricated on the base layer 720. As one example, the base layer 720 can be a silicon (Si) wafer and the active circuitry 732 and 734 can be microelectronic devices formed on the base layer 720 using a CMOS fabrication process. The active circuitry 732 and 734 in base layer 720 can be used to implement the non-memory portions of the circuitry depicted in FIGS. 1-6, such as the circuitry in interface logic 620 depicted in FIG. 6. The memory cells 680 and their respective conductive array lines (692, 694) can be fabricated on top of the active circuitry 732 and 734 in the base layer 720 and the memory cells 680 can be used to implement the memory elements 102 and 202a-202e depicted in FIGS. 1-4.

Those skilled in the art will appreciate that an inter-level interconnect structure (not shown) can electrically couple the conductive array lines (692, 694) with the active circuitry 732 and 734 which may include several metal layers. For example, vias can be used to electrically couple the conductive array lines (692, 694) with the active circuitry 732 and 734. The active circuitry 732 and 734 may include but is not limited to the circuitry portions depicted in FIGS. 1-4, address decoders, sense amps, memory controllers, data buffers, direct memory access (DMA) circuits, voltage sources for generating the read and write voltages, just to name a few. For example, active circuits 810-818 can be configured to apply the select voltage potentials (e.g., read and write voltage potentials) to selected conductive array lines (692', 694')

for selected memory cell 680' via terminals 605 and 607 that are electrically coupled with outputs of active circuits 814 and 818 respectively.

Moreover, active circuits 810-818 can be electrically coupled with the conductive array lines (692', 694') to sense the read current $I_R$ from selected memory cells 680' during a read operation and the sensed current can be processed by active circuits 810-818 to determine the conductivity profiles (e.g., the resistive state) of the selected memory cells 680'. In some applications, it may be desirable to prevent un-selected array lines (692, 694) from floating. The active circuits 810-818 can be configured to apply an un-select voltage potential (e.g., approximately a ground potential) to the un-selected array lines (692, 694). A dielectric material 811 (e.g., $SiO_2$) may be used where necessary to provide electrical insulation between elements of the integrated circuit 700.

Although only a single layer of memory 712 is depicted in FIG. 8A, additional layers of memory (e.g., 742a-742n) can be vertically fabricated BEOL above an upper surface 692t of conductive array line 692 to form a multi-layer cross-point memory array. The vertically stacked layers of memory can have electrically isolated conductive array lines as depicted in FIGS. 6-8A or can have shared conductive array lines as depicted in FIGS. 5, 9, and 10.

Figure 8B:
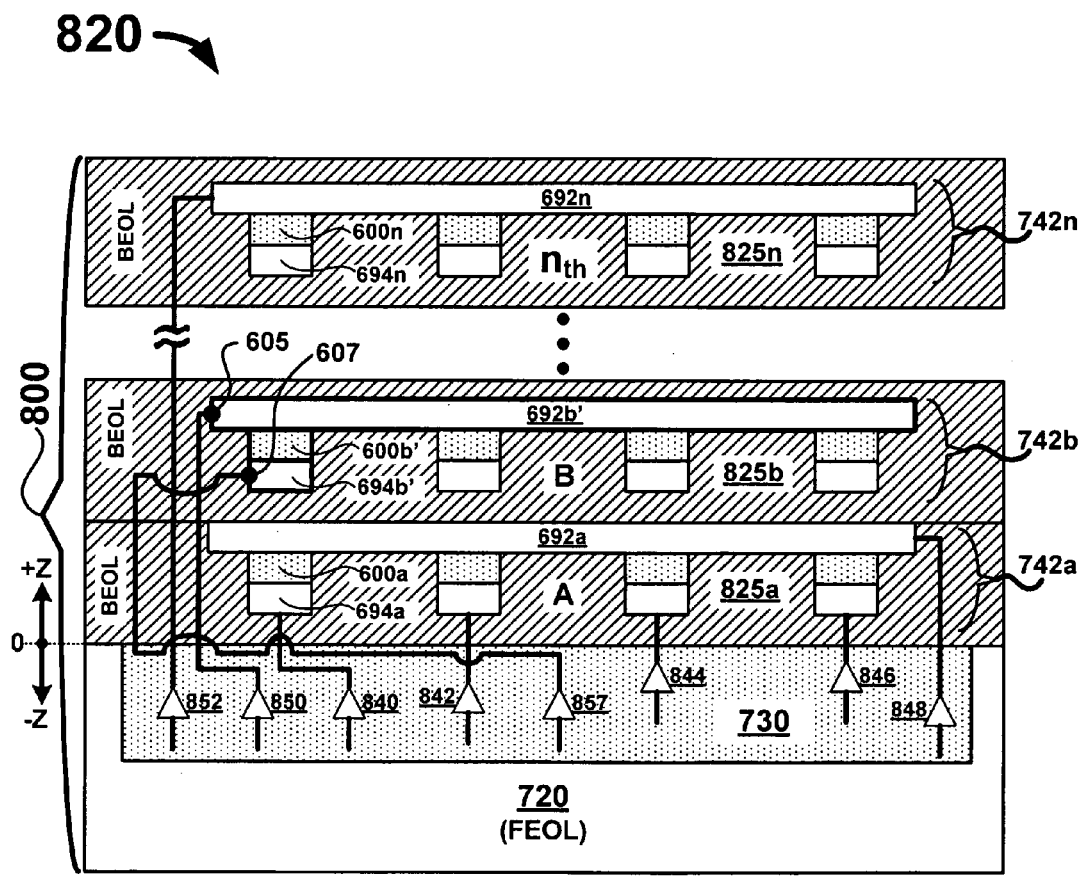
FIG. 8B depicts a cross-sectional view of an integrated circuit including vertically stacked layers of memory fabricated over a substrate including active circuitry fabricated in a logic layer.

Turning now to FIG. 8B, an integrated circuit 820 includes a plurality of non-volatile memory arrays that are vertically stacked above one another (e.g., along the Z-axis) and are positioned above the base layer 720 that includes the active circuitry 730. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 600a and first and second conductive array lines (692a, 694a), Layer B includes memory cells 600b and first and second conductive array lines (692b, 694b), and if the nth layer is implemented, then the nth layer includes memory cells 600n and first and second conductive array lines (692n, 694n). Dielectric materials 825a, 825b, and 825n (e.g., $SiO_2$) may be used where necessary to provide electrical insulation between the memory layers and memory elements of the integrated circuit 820. Active circuits 840-857 can be configured to apply the select voltage potentials (e.g., read and write voltage potentials) to selected conductive array lines (e.g., 692a, b, . . . n, and 694a, b, . . . n). Driver circuits 850 and 857 are activated to select conductive array lines 692' and 694' to select memory cell 600b' for a data operation. As was described above, the active circuits 730 can be used to sense the read current $I_R$ from selected memory cells 600b' during a read operation and can be configured to apply the un-select voltage potential to the un-selected array lines.

Figure 9:
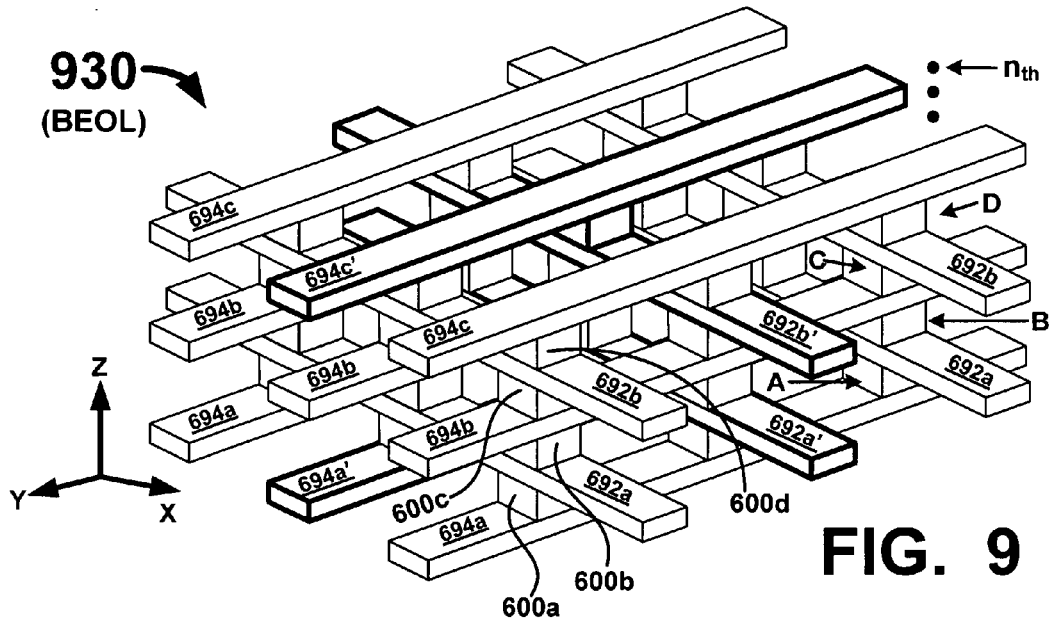
FIG. 9 depicts a vertically stacked layers of memory in which conductive array lines are shared by memory cells in adjacent layers.

Attention is now directed to FIG. 9, where a vertically stacked array 930 includes a plurality of memory layers A, B, C, and D with each memory layer including memory cells 600a, 600b, 600c, and 600d. Although only four layers are depicted, the array 930 can include additional layers up to an nth layer. The array 930 includes two levels of x-direction conductive array lines 692a and 692b, and three levels of y-direction conductive array lines 694a, 694b, and 694c. In contrast to the integrated circuit 820 depicted in FIG. 8B where each array layer is electrically isolated from other layers by a dielectric material (825a, 825b, . . . 825n), each memory cell 600a, 600b, 600c, and 600d shares a conductive array line with other memory cells that are positioned above, below, or both above and below that memory cell. Conductive array lines 692a' and 694a' select a memory cell 600a' for a data operation, and conductive array lines 692b' and 694c' select a memory cell 600d' for a data operation (see FIG. 10).

Figure 10:
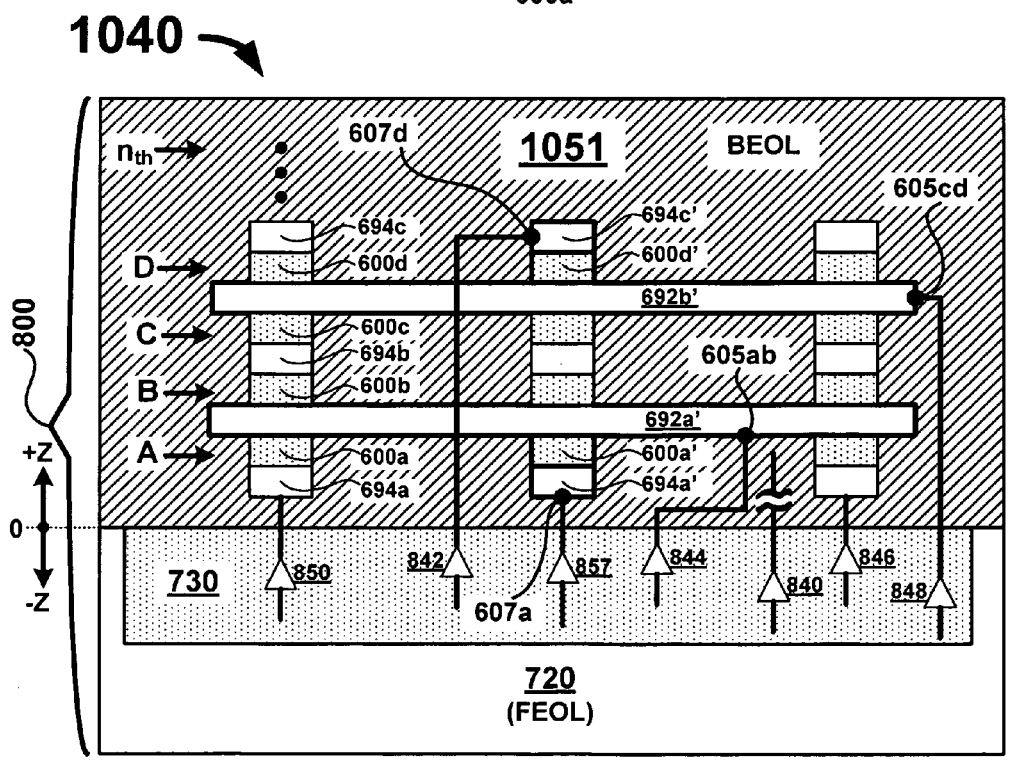
FIG. 10 depicts an integrated circuit including vertically stacked layers of memory with shared conductive array lines fabricated over a substrate including active circuitry fabricated in a logic layer.

In FIG. 10, an integrated circuit 1040 includes base layer 720, active circuitry 730, and vertically staked memory layers A, B, C, and D that are fabricated above the base layer 720. Active circuits 840-857 are configured to perform data operations on the vertically staked memory layers A, B, C, and D. Driver circuits 844 and 857 are activated to select memory cell 600a' for a data operation and driver circuits 842 and 848 are activated to select memory cell 600d' for a data operation. A dielectric layer 1051 is operative to electrically isolate the various components of integrated circuit 1040.

Figure 11:
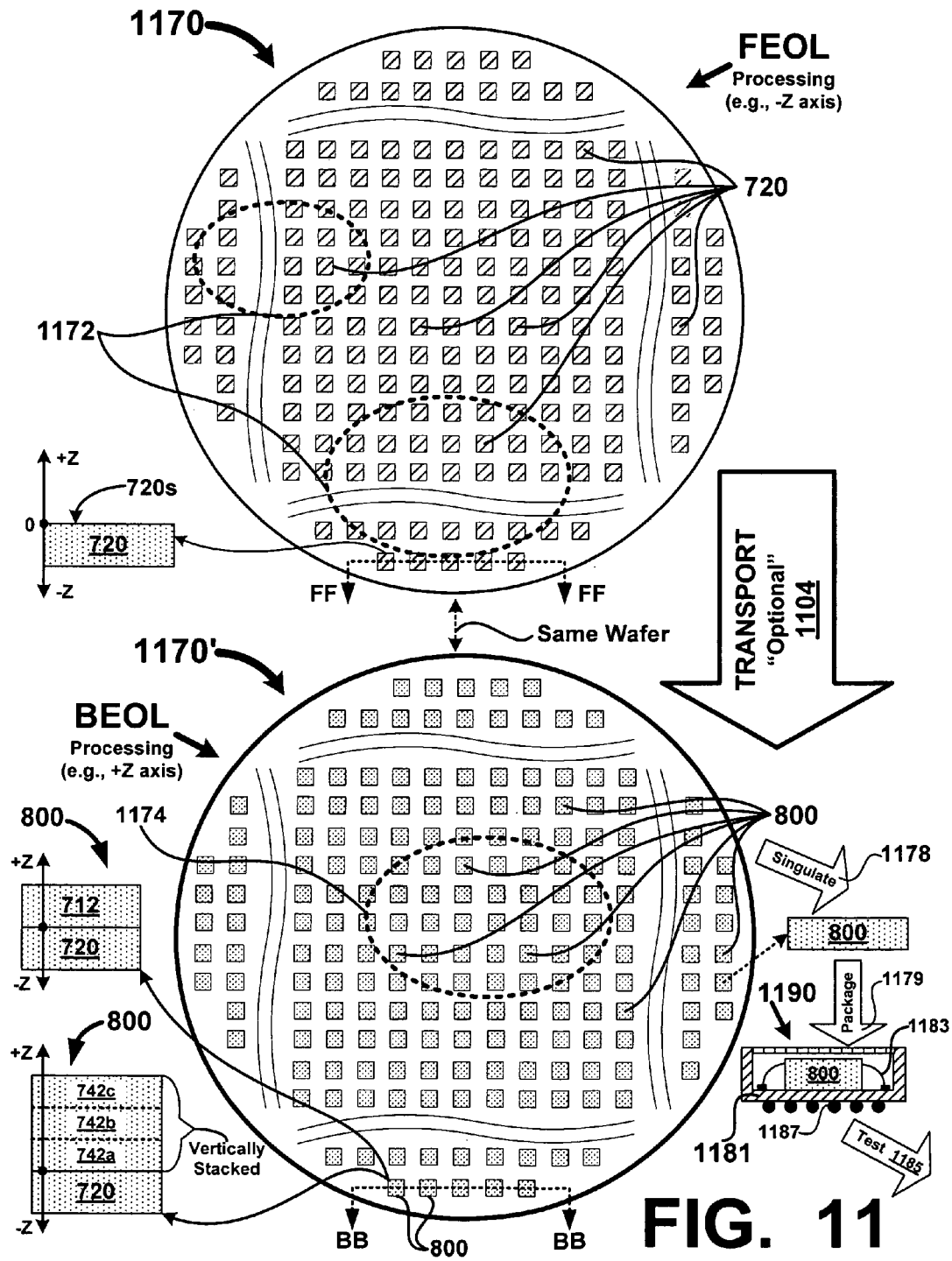
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742a, 742b, . . . 742n) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720s of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 10) that includes the FEOL circuitry portion 720 along the −Z axis and the BEOL memory portion along the +Z axis (see FIGS. 8A-10). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742a, 742b, and 742c grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield.

One or more of the IC's 1190 can be used in systems including but not limited to data storage systems, a system that requires dual-port memory, a system requiring non-volatile memory, a system requiring emulation of one or more memory types as described above. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation and/or other FLASH operations are eliminated.

The foregoing examples have been described in some detail for purposes of clarity of understanding, but are not limited to the details provided. There are many alternative ways and techniques for implementation. The disclosed examples are illustrative and not restrictive.

What is claimed is:

1. A memory system, comprising:
a back-end-of-the-line (BEOL) portion including a non-volatile third dimensional memory array, the non-volatile third dimensional memory array including a memory element, wherein the memory element is configured to change from a first resistive state to a second resistive state in response to a voltage;
a front-end-of-the-line (FEOL) portion including active circuitry, the active circuitry including a transceiver gate configured to gate the voltage to the memory element, the voltage being configured to change the memory element from the first resistive state to the second resistive state, wherein the transceiver gate is further configured to receive another voltage from a bit line and a bit bar line, the bit line and the bit bar line being electrically coupled with the memory element and configured to provide the another voltage; and
a plurality of word lines electrically coupled with the memory element, wherein the plurality of word lines are configured to provide substantially simultaneous access to the non-volatile third dimensional memory array using two or more ports.

2. The memory system of claim 1, wherein the substantially simultaneous access occurs randomly.

3. The memory system of claim 1, wherein the non-volatile third dimensional memory array uses two terminals.

4. The memory system of claim 1, wherein the non-volatile third dimensional memory array is vertically stacked.

5. The memory system of claim 1, wherein the non-volatile third dimensional memory array comprises a cross-point architecture.

6. The memory system of claim 1, wherein the non-volatile third dimensional memory array further comprises an access port, the access port being associated with the transceiver gate.

7. The memory system of claim 1, wherein the memory array further comprises two or more access ports associated with the non-volatile third dimensional memory.

8. The memory system of claim 1, wherein each memory element is a two-terminal memory element that is included in and is electrically in series with a two-terminal memory cell.

9. A non-volatile system, comprising:
a back-end-of-the-line (BEOL) portion including a third dimensional memory array including a memory element, wherein the memory element is configured to change a resistive state when a voltage is applied, the voltage being measured between a first terminal and a second terminal;
a front-end-of-the-line (FEOL) portion including active circuitry, the active circuitry including an access transistor configured to gate the voltage and to provide access to the memory element, wherein the access transistor is configured to receive another voltage from a bit line and a bit bar line, wherein the bit line and the bit bar line are electrically coupled with the memory element, the another voltage indicating a data bit to be stored in the memory element, the data bit being determined by evaluating a voltage difference; and
a plurality of word lines electrically coupled with the memory element, wherein the plurality of word lines are configured to provide two or more ports substantially simultaneous access to the third dimensional memory array, wherein the substantially simultaneous access occurs randomly.

10. The non-volatile system of claim 9, wherein the memory element is configured to change from a first resistive state to a second resistive state.

11. The non-volatile system of claim 9, wherein the third dimensional memory array uses two or more terminals.

12. The non-volatile system of claim 9, wherein the third dimensional memory array is vertically stacked.

13. The non-volatile system of claim 9, wherein the third dimensional memory array is cross-point accessible.

14. The non-volatile system of claim 9, wherein the third dimensional memory array comprises two or more transceiver gates associated with each access port.

15. The non-volatile system of claim 9, wherein the third dimensional memory array uses two or more access ports associated with the memory element.

16. The non-volatile system of claim 9, wherein the third dimensional memory array is configured to conduct a further voltage across the memory element during a read operation, wherein the read operation is non-destructive.

17. The non-volatile system of claim 9, wherein the third dimensional memory array is configured to conduct the voltage and the another voltage across the memory element during a write operation, wherein the write operation is not preceded by an erase operation.

18. The memory system of claim 9, wherein each memory element is a two-terminal memory element that is included in and is electrically in series with a two-terminal memory cell.

19. A non-volatile memory system, comprising:
a back-end-of-the-line (BEOL) third dimensional rewritable memory array including a memory element, wherein the memory element comprises a plurality of word lines electrically coupled with a row address decoder, wherein the memory element is configured to receive a read voltage and to pass the read voltage to a sense amplifier;
a write driver configured to conduct an incoming voltage to access the memory element, wherein the write driver is configured to provide the incoming voltage to enable a bit line and a bit bar line to receive a voltage pulse, wherein the voltage pulse is configured to enable a data bit to be stored in the memory element, wherein the data bit is determined by evaluating a voltage difference measured between a first terminal and a second terminal;

a read transistor configured to pass the read voltage to the memory element, wherein the read transistor is enabled by the row address decoder; and a plurality of columns configured to conduct another read voltage to the memory array, the another read voltage being used to read another data bit by evaluating another voltage difference between the first terminal and the second terminal, and the plurality of columns being further configured to conduct another voltage pulse to write data to the third dimensional rewritable memory array by changing a resistive state of the memory element, and wherein active circuitry electrically coupled with the BEOL third dimensional rewritable memory array comprises front-end-of-the-line (FEOL) circuitry fabricated on a substrate the BEOL third dimensional rewritable memory is positioned over and is in contact with.

20. The non-volatile memory system of claim 19, wherein the memory element is configured to conduct the read voltage, the read voltage being conducted over the bit line to the sense amplifier.

21. The non-volatile memory system of claim 19, wherein the third dimensional rewritable memory array further comprises a column address decoder and an output driver.

22. The non-volatile memory system of claim 19, wherein the sense amplifier is electrically coupled with a resistive reference cell.

23. The non-volatile memory system of claim 19, wherein the third dimensional rewritable memory array is configured to provide substantially simultaneous access using two or more ports.

24. The non-volatile memory system of claim 19, wherein the memory element is configured to change the resistive state when a voltage pulse is applied to the memory element.

25. The non-volatile memory system of claim 19, wherein the third dimensional rewritable memory array is configured to provide access to the memory element using two or more ports.

26. The non-volatile memory system of claim 19, wherein the third dimensional rewritable memory array is configured to enable the incoming voltage to access the memory element.

27. The non-volatile memory system of claim 19, wherein the memory element is configured to receive the incoming voltage from the write driver, the write driver being coupled to the bit line and bit bar line.

28. The non-volatile memory system of claim 19, wherein the third dimensional rewriteable memory array is further configured to use with an interface protocol to emulate DRAM-type memory.

29. The non-volatile memory system of claim 19, wherein the third dimensional rewriteable memory array is further configured to use with an interface protocol to emulate SRAM-type memory.

30. The non-volatile memory system of claim 19, wherein the third dimensional rewriteable memory array is further configured to use with an interface protocol to emulate Flash-type memory.

31. The memory system of claim 19, wherein each memory element is a two-terminal memory element that is included in and is electrically in series with a two-terminal memory cell.

* * * * *